(12) United States Patent
Chen et al.

(10) Patent No.: US 6,773,616 B1
(45) Date of Patent: Aug. 10, 2004

(54) FORMATION OF NANOSCALE WIRES

(75) Inventors: Yong Chen, Palo Alto, CA (US); Douglas A. A. Ohlberg, Mountain View, CA (US); Theodore I. Kamins, Palo Alto, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 230 days.

(21) Appl. No.: 10/033,408

(22) Filed: Dec. 26, 2001

Related U.S. Application Data (63) Continuation-in-part of application No. 10/008,058, filed on Nov. 13, 2001, now Pat. No. 6,656,573.

(51) Int. Cl.$^7$ ............................ B44C 1/22; H01L 21/00
(52) U.S. Cl. ............................ 216/41; 216/66; 216/74; 216/77; 216/78; 216/79; 438/689; 438/733
(58) Field of Search ............................ 216/41, 66, 74, 216/77, 78, 79; 438/689, 733

(56) References Cited

U.S. PATENT DOCUMENTS

| | | | | |
|---|---|---|---|---|
| 5,045,408 | A | | 9/1991 | Williams et al. ............ 428/620 |
| 5,344,792 | A | * | 9/1994 | Sandhu et al. .............. 438/660 |
| 5,814,563 | A | * | 9/1998 | Ding et al. ................. 438/714 |
| 6,294,450 | B1 | * | 9/2001 | Chen et al. ................. 438/597 |
| 6,297,063 | B1 | * | 10/2001 | Brown et al. .................. 438/2 |
| 6,440,637 | B1 | * | 8/2002 | Choi et al. .................. 430/296 |

OTHER PUBLICATIONS

P.M. Petroff et al. "MBE and MOCVD Growth and Properties of Self–Assembling Quantum Dot Arrays in III–V Semiconductor Structures", Superlattices and microstructures, vol. 15, pp. 15–21 (1994).

Yong Chen et al, "Self–assembled growth of epitaxial erbium disilicide nanowires on silicon (001)", Applied Physics Letters, vol. 76, No. 26, pp. 4004–4006 (Jun. 26, 2000).

K.L. Kavanagh et al, "High–temperature epitaxy of PtSi/Si(0 0 1)", Journal of Crystal Growth, vol. 173 pp. 393–401 (1997).

* cited by examiner

*Primary Examiner*—Nadine G. Norton
*Assistant Examiner*—Shamim Ahmed (57) ABSTRACT

Self-organized, or self-assembled, nanowires of a first composition may be used as an etching mask for fabrication of nanowires of a second composition. The method for forming such nanowires comprises: (a) providing an etchable layer of the second composition and having a buried insulating layer beneath a major surface thereof; (b) growing self-assembled nanowires on the surface of the etchable layer; and (c) etching the etchable layer anisotropically down to the insulating layer, using the self-assembled nanowires as a mask. The self-assembled nanowires may be removed or left. In either event, nanowires of the second composition are formed. The method enables the formation of one-dimensional crystalline nanowires with widths and heights at the nanometer scale, and lengths at the micrometer scale, which are aligned along certain crystallographic directions with high crystal quality. Further, the method of the present invention avoids traditional lithography methods, minimizes environmental toxic chemicals usage, simplifies the manufacturing processes, and allows the formation of high-quality one-dimensional nanowires over large areas.

54 Claims, 5 Drawing Sheets

FORMATION OF NANOSCALE WIRES

CROSS-REFERENCE TO RELATED APPLICATION

The present application is a continuation-in-part application of application Ser. No. 10/008,058, filed on Nov. 13, 2001, now U.S. Pat. No. 6,665,573. This application is directed to the formation of self-assembled nanowires on silicon, used in the practice of the present invention.

TECHNICAL FIELD

The present invention is related generally to electronic devices whose functional scales are measured in nanometers, and, more particularly, to forming one-dimensional epitaxial crystals with widths and heights at the nanometer scale.

BACKGROUND ART

The synthesis of artificial low-dimensional structures to confine electrons has been a topic of scientific and technical interest for decades. Epitaxial deposition techniques have made possible the growth of two-dimensional quantum wells as thin as one atomic layer and "zero"-dimensional islands as small as a few nanometers. However, the formation of robust "one"-dimensional nanowires with a width less than 10 nm has been a major goal that has proven difficult to achieve by either epitaxial growth or lithographic processing. Various "self-assembly" techniques, in which structures form spontaneously under kinetic or thermodynamic control, have been used to grow wire-like structures directly on a semiconductor surface. Previous demonstrations include decoration of step edges on substrates, the preferential capture of adatoms onto an oriented string of dangling bonds at a surface, the growth of a lattice-matched epilayer with anisotropic surface energy, and the growth of a lattice-mismatched epitaxial layer on a low symmetry substrate with a large anisotropic stiffness. Each of these techniques depends on some type of symmetry-breaking phenomenon at the substrate surface to encourage linear growth along a preferred direction. However, they often produce wire-like structures that meander along with the steps, are terminated by single steps, have irregular shapes and sizes, and/or are not robust.

In general, an atomically flat two-dimensional epitaxial overlayer can be grown when the lattice constant of the epilayer matches that of the substrate on which it is grown. As the lattice-mismatch increases ($\geq 9\%$), the strain energy in the deposited film can be relaxed by the creation of islands of the epitaxial material. In the cases of the most often studied systems, e.g., Ge on Si(001) and InAs on GaAs (001), both the substrate surfaces and the overlayers have fourfold crystallographic symmetry with respect to the surface normal. These lattice-mismatched systems will thus limit the lateral growth in all directions on the substrate surface and produce strained islands. This suggests a strategy for the intentional epitaxial growth of linear structures: choose an overlayer material that is closely lattice matched to the substrate along one major crystallographic axis but has a significant lattice mismatch along the perpendicular axis. In principle, this should allow the unrestricted growth of the epitaxial crystal in the first direction but limit the width in the other.

In the above-referenced co-pending application, self-assembled epitaxial nanowires comprising an epitaxial crystal comprising a first material (e.g., a metal silicide) are grown on a crystal substrate comprising a second material (e.g., silicon). The wires normally have the widths from 1 to 100 nm and lengths from 10 nm to 10 $\mu$m. The formation mechanism of the metal silicide wires is due to the asymmetry of lattice mis-matches between metal silicide and the silicon substrate. The present inventors have discovered that metal silicide nanowires grown on Si form a natural shadow mask for etching silicon. Such masks are ordinarily difficult to make on a nanoscale, due partly to the extremely small dimensions and due partly to the need to employ materials having differential etch rates.

The silicon nanowires are critical elements for future nanoscale electronic and opto-electronic devices. A method for using self-assembled nanowires as a shadow mask to fabricate Si nanowires can be very important. Further, the use of self-assembled nanowires as a mask for fabricating nanowires of other materials can also be very important.

DISCLOSURE OF INVENTION

In accordance with the present invention, self-organized, or self-assembled, nanowires having a first composition are used as an etching mask for fabricating nanowires having a second composition. The process for forming such nanowires of the second composition comprises:

(a) providing an etchable layer having the second composition and having a buried insulating layer beneath a major surface thereof;

(b) growing self-assembled nanowires having the first composition on the surface of the etchable layer; and (c) anisotropically etching portions of the etchable layer down to the insulating layer, using the self-assembled nanowires as a mask, to form the nanowires of the second composition.

The self-assembled nanowires may subsequently be removed from the etched nanowires or left in place.

Further in accordance with the present invention, self-organized, or self-assembled, metal silicide nanowires may be used as an etching mask for silicon nanowire fabrication. The process for forming such Si nanowires comprises:

(a) providing a silicon substrate having a buried insulating layer beneath a major surface thereof;

(b) growing self-assembled nanowires on the silicon surface; and (c) anisotropically etching silicon down to the insulating layer, using the self-assembled nanowires as a mask, to form the silicon nanowires.

As above, the self-assembled nanowires may subsequently be removed from the silicon nanowires or left in place.

The present invention provides a means to form essentially one-dimensional crystalline nanowires with widths and heights at the nanometer scale, and lengths at the micrometer scale, which are aligned along certain crystallographic directions with high crystal quality. Further, the present invention avoids traditional lithography methods, minimizes environmental toxic chemicals usage, simplifies the manufacturing processes, and allows the formation of high-quality one-dimensional nanowires over large areas.

BEST MODES FOR CARRYING OUT THE INVENTION

In general, an atomically flat two-dimensional epitaxial overlayer can be grown when the lattice constant of the epilayer matches that of the substrate on which it is grown. As the lattice-mismatch increases (>2%), the strain energy in the deposited film can be relaxed by the creation of islands of the epitaxial material; see, e.g., P. M. Petroff et al, "MBE and MOCVD Growth and Properties of Self-Assembling Quantum Dot Arrays in III–V Semiconductor Structures", *Superlattices and Microstructures*. Vol. 15, pp. 15–21 (1994. In the cases of the most studied systems, e.g., Ge on Si(001), and InAs on GaAs(001), both the substrate surfaces and the overlayers have four-fold crystallographic symmetry with respect to the surface normal. These lattice-mismatched systems will thus limit the lateral growth in all directions on the substrate surface and produce strained islands; see, Petroff et al, supra.

The intentional epitaxial growth of linear structures is provided herein that involves choosing an overlayer material that is closely-lattice matched to the substrate along one major crystallographic axis but has a significant lattice mismatch along all other crystallographic axes within the interface between the epitaxial crystal and the substrate. In principle, this allows the unrestricted growth of the epitaxial crystal in the first direction but limits the width in the other. In general, any crystalline material that can be characterized by an asymmetric lattice mismatch, in which the first material has a close lattice match (in any direction) with the second material and has a large lattice mismatch along all other crystallographic axes within the interface between the epitaxial crystal and the substrate. By a close lattice match is meant that the absolute value of lattice mismatch between the two crystal materials is less than 4%. By a large lattice mismatch is meant that the absolute value of lattice mismatch between the two crystal materials is within the range of about 4 to 10%. While in principle any crystallographic direction may be chosen, preferably, the asymmetric lattice mismatch occurs along a major (or low Miller-index) crystallographic direction within the interface between the epitaxial crystal and the substrate. By "major crystallographic direction" is meant any direction along which the crystalline material comprising the nanowire may prefer to grow within the interfacial plane.

In principle, any single crystal material that is useful in the fabrication of nanowires may be used in combination with any single crystal material that serves as a layer on which the nanowires can be grown, provided that the asymmetric lattice mismatch conditions described above are met One preferred combination, described next, includes metal silicides grown on silicon substrates. However, the same teachings herein may be employed, using self-assembled crystals grown on single crystal layers such as metals, oxides, such as sapphire, semiconductors, such as germanium, III–V compound semiconductors, whether binary (e.g., GaAs, InP, etc.), ternary (e.g., InGaAs), or higher (e.g., InGaAsP), II–VI compound semiconductors, and IV–VI compound semiconductors. Examples of such combinations are listed in U.S. Pat. No. 5,045,408, entitled "Thermodynamically Stabilized Conductor/Compound Semiconductor Interfaces", issued on Sep. 3, 1991, to R. Stanley Williams et al, the contents of which are incorporated herein by reference.

Specific examples of substrate materials include as semiconductor materials the following: Si, Ge, $Ge_xSi^{1-x}$ where 0<x<1, GaAs, InAs, AlGaAs, InGaAs, AlGaAs, GaN, InN, AlN, AlGaN, and InGaN. Specific examples of substrate materials include as metals the following: Al, Cu, Ti, Cr, Fe, Co, Ni, Zn, Ga, Nb, Mo, Pd, Ag, In, Ta, W, Re, Os, Ir, Pt, and Au, and alloys thereof.

In light of the foregoing, it will be appreciated that the self-assembled nanowires may comprise a first composition and that the layer on which the self-assembled nanowires is formed may comprise a second composition, provided that the two compositions meet the epitaxial growth conditions outlined above. However, for ease of illustrating the present invention, the following discussion is directed to the formation of self-assembled metal silicide wires on a silicon layer, with the silicon layer subsequently etched, using the self-assembled metal silicide wires as a mask. The etching of the silicon layer in this fashion results in the creation of silicon nanowires.

Figure 1:
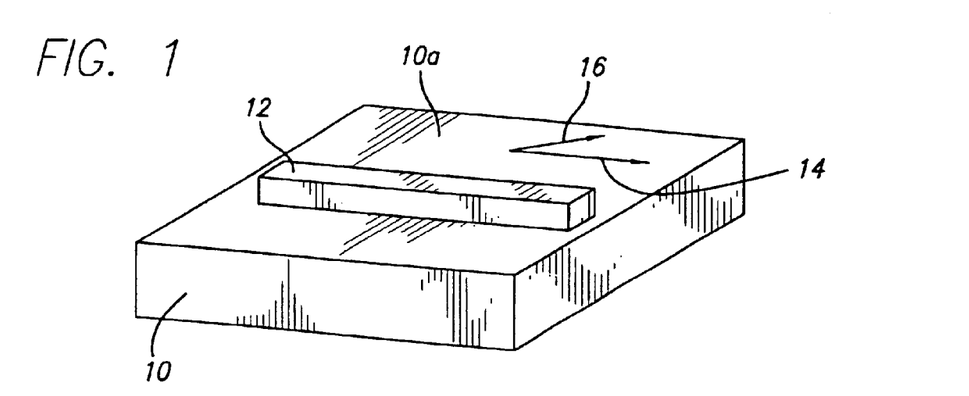
FIG. 1 is a perspective view of a single crystal substrate and an epitaxial self-assembled nanowire thereon, depicting the lattice-mismatch axes.

FIG. 1 depicts a silicon(001) substrate 10 on the top surface 10a of which is grown a single crystal nanowire 12. The axis with small lattice-mismatch is denoted 14, while the axis with larger lattice-mismatch is denoted 16.

In one embodiment, the epitaxial material comprising the nanowires is preferably represented as $MSi_2$, where M is a metal selected from the group consisting of Sc, Y, and rare earths, where the layer material preferably comprises a silicon(001) layer. Preferred rare earths include Er, Dy, Gd, Th, Ho, Th, and Sm.

The method of the above-identified co-pending application [PD-10992215-2] for forming the nanowires of the first material on a surface of the second material comprises:

(a) selecting the appropriate epitaxial material and its growth substrate with an appropriate asymmetric lattice-mismatch;

(b) cleaning a surface of the layer so that the surface has an atomically flat, regular atomic structure on terraces and has regular steps and so that impurities are removed; and (c) epitaxially depositing the (single crystalline) epitaxial material on the surface of the single crystal layer. Such epitaxial deposition employs an appropriate deposition rate, deposited material amount, deposition temperature, and post-growth annealing temperature and time. It is well known that different material systems and different deposition systems will require values that are unique to that particular system. However, the deposition of metal disilicides on silicon is known, and, based on the teachings herein and in the prior art, conventional experimentation is sufficient to determine the specific values for a given material system and deposition system.

The cleaning step may be performed by heating the layer to an elevated temperature, such as about 1000° to 1200° C., in a high vacuum, such as less than $1\times10^{-9}$ Torr for a few minutes, and then cooling. Alternatively, a combination of chemical and ultraviolet treatments may be used, such as HF to remove surface $SiO_2$, UV to decompose carbon impurities on the surface, and a strong acid, such as $H_2SO_4$ or HCl, to remove organic impurities.

Steps occur naturally in polished crystal layers, and while it is preferred that they be absent, nonetheless, the teachings of the present invention may be used in the presence of such steps, so long as flat terraces, a regular atomic structure on the terraces, and regular steps can be obtained. This is the purpose of the layer surface cleaning.

The epitaxial deposition is preferably performed with an in situ electron-beam evaporator, employing substrate temperatures ranging from room temperature (~23° C.) to 800° C.

In the case that two or more crystallographic axes on the layer surface have a small lattice-mismatch between the epitaxial layer and the single crystal layer, this will lead to two or more sets of nanowires grown along these crystallographic axes. In order to grow only one set of parallel nanowires, one can use layers misoriented with small angles away from the major crystallographic axis to create steps aligned in parallel in one direction. By a "small" angle is meant an angle in the range from 0.1 to 10 degrees. By using such misoriented layers, the growth of the nanowires parallel to the steps will be promoted and the growth of nanowires not parallel to the steps will be suppressed.

The dimensions of the nanowires can be controlled by the lattice-mismatch, layer surface morphology, and growth conditions. The widths and heights of the nanowires in general will decrease as the large lattice mis-match along the width direction increases, since it is energetically unfavorable to attach adatoms along the width directions with larger lattice-mismatch. The length will increase with the decrease of the lattice-mismatch along the length direction, since it is energetically favorable to attach adatoms to the less lattice-mismatched sites. One can grow nanowires with desired dimensions by selecting epitaxial materials with designed lattice-mismatches. One can also grow epitaxial alloys of different materials to fine-tune the lattice-mismatches to the desired values. For example, a mixed disilicide of, for example, erbium and dysprosium, could be formulated to obtain a nanowire composition having a desired lattice-mismatch value, such as by interpolating values of each disilicide.

The layer surface and step morphology may also influence the nanowire morphology significantly. The growth of a nanowire may be terminated by reaching a step bunch or by intersecting a perpendicular nanowire. In order to increase the nanowire length, one can use a substrate with wide terraces (therefore less steps), or use a substrate misoriented from major crystallographic axes with a small angle (0.1 to 10 degrees) to create steps in a parallel direction and promote the growth of the parallel nanowires. That is to say, uniaxial nanowires may be grown on a layer surface with uniaxial regular atomic steps wherein either the layer surface is so misoriented or its normal direction is so misoriented.

Figure 2A:
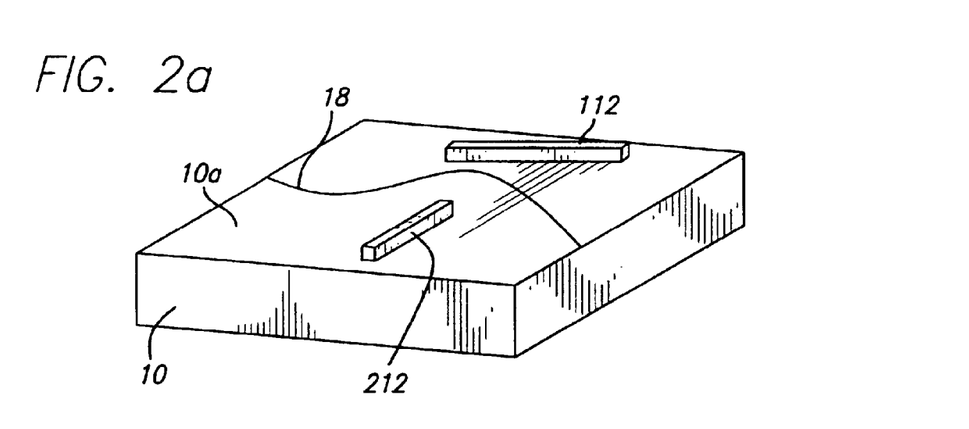
FIGS. 2a–2b are each a perspective view of self-assembled nanowires formed on a substrate surface with an irregular surface step (FIG. 2a) and with regular surface steps (FIG. 2b)
Figure 2B:
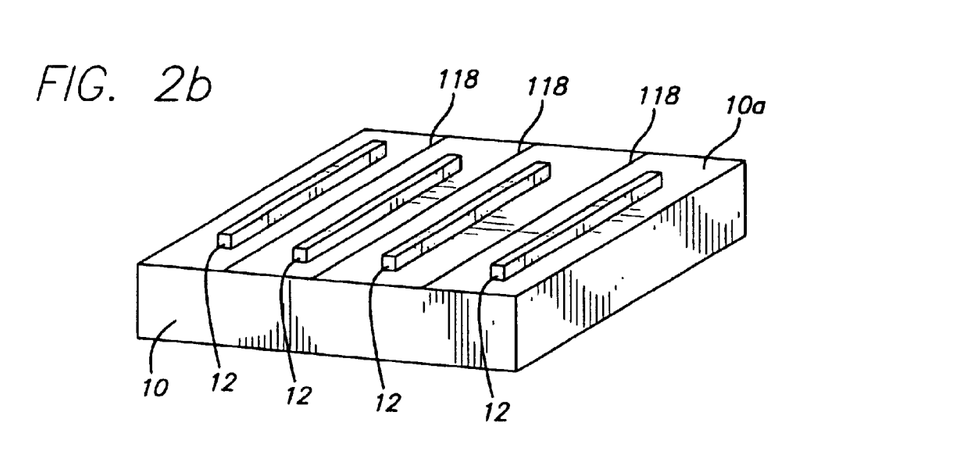

FIG. 2a illustrates an undesirable situation, in which an irregular surface step 18 exists on the surface 10a of the silicon layer 10. Here, nanowires 112 and 212 are formed aligned in different directions. On the other hand, FIG. 2b illustrates a desirable situation, in which regular surface steps 118 occur in a parallel, aligned manner. Consequently, self-assembled nanowires 12 are also formed in a parallel, aligned manner.

Figure 3A:
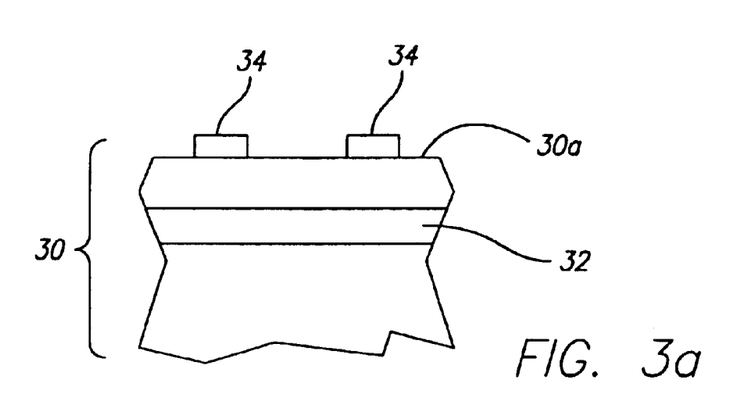
FIGS. 3a–3c depict the sequence of steps relating to transferring patterned self-assembled nanowires to Si nanowires.
Figure 3B:
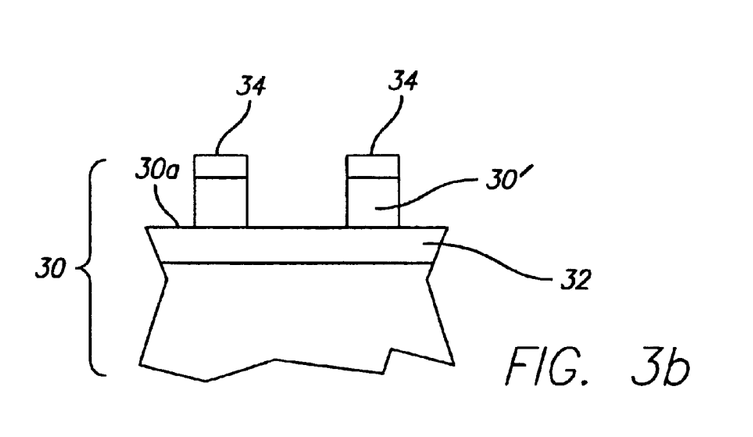
Figure 3C:
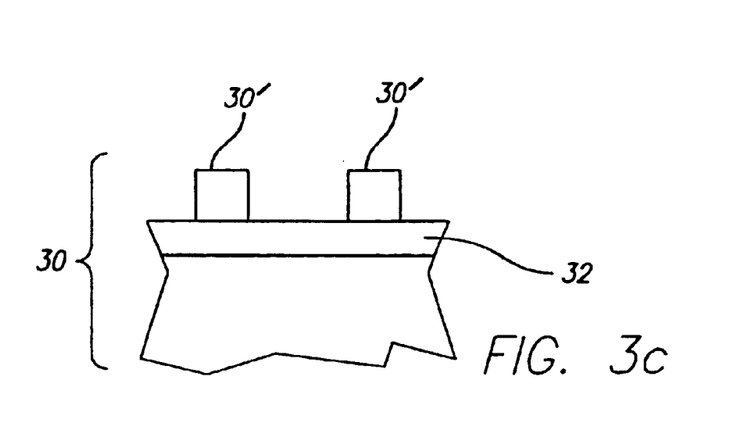

Referring now to FIGS. 3a–3c, the process for forming Si nanowires in accordance with the present invention comprises:

(a) providing a silicon layer having a buried insulating layer beneath a major surface thereof;

(b) growing self-assembled nanowires on the silicon surface; and (c) anisotropically etching silicon down to the insulating layer, using the self-assembled nanowires as an etching mask, to form the silicon nanowires.

The self-assembled nanowires may be subsequently removed from the silicon nanowires or left in place.

After step (b), the differential etch rate between the nanowires and the substrate may be enhanced by deposition other molecular or atomic species that preferentially bond to the nanowires.

As indicated earlier, the foregoing process may employ a layer other than silicon formed on the insulating layer and self-assembled nanowires other than metal disilicides to form nanowires other than silicon.

Removing the self-assembled nanowires leaves Si nanowires behind, having thicknesses and heights on the order of nanometer dimensions and lengths considerably longer, approaching, and even extending into, micrometer dimensions.

The thickness range of the silicon layer (from the top thereof to the buried insulating layer) is chosen to be comparable with the width of the self-assembled nanowires, namely, within the range from about 1 to 100 nm.

While the buried insulating layer may, in general, comprise any insulating material, preferably, an oxide is employed. Most preferably, that oxide is silicon dioxide, $SiO_2$. However, a nitride, specifically, silicon nitride, or a mixture of an oxide and a nitride, specifically, a silicon oxy-nitride, may alternatively be employed in the practice of the present invention. Or, a fluoride such as $CaF_2$ may be used as the buried insulating layer.

The buried insulating layer is formed by conventional processes well known in semiconductor processes. The depth at which the insulating layer is formed beneath the surface of the silicon substrate dictates the thickness of the silicon nanowires. The formation of buried insulating layers is well known in semiconductor processing and is not a part of the present invention.

The details of growth of the metal silicide nanowire are disclosed above. Once the metal silicide nanowires have been grown, an anisotropic etchant is used to preferentially etch the silicon substrate down to the insulating layer. A preferred etching process employs reactive ion etching (RIE), which can be made to etch silicon at a faster rate than metal silicides or other species used to coat the nanowires. Preferably, the silicon is etched at a significantly faster rate, at least twice as fast, as the metal silicide nanowires. An example of the RIE etching conditions for Si is as follows:

etching gas: $CF_4:SF_6:Ar=25$ sccm:125 sccm:60 sccm;

pressure: 50 mTorr;

power: 100 W; and etching rate: ~2 nm/min.

The self-assembled nanowires are then removed, again, using an anisotropic etchant, for example, a chemical etchant, which can etch the self-assembled nanowires at a rate faster than the Si nanowires. Preferably, the metal silicide is etched at a rate that is at least twice that of the silicon nanowires. An example of such an anisotropic etchant that etches metal silicides faster than silicon is HF acid.

FIG. 3a depicts the formation of metal silicide wires 34 on the surface 30a of the silicon substrate 30, which has the buried insulating layer 32. FIG. 3b depicts the effect of anisotropically etching away the areas of silicon that are not covered with the metal silicide nanowires, leaving Si wires 30' beneath the metal silicide nanowires 34. The insulating layer 32 acts as an etch-stop to prevent further etching by the anisotropic etching process. FIG. 3c depicts the remaining Si nanowires 30' remaining after etching the metal silicide nanowires away with HF acid.

The foregoing discussion is presented generally in terms of the use of metal silicide nanowires. However, it will be appreciated that just about all silicide nanowires, and, indeed, just about all types of self-assembled nanowires, may be efficaciously employed in the practice of the present invention. Indeed, the present inventors know of no reason that would prevent the use of any silicide nanowire nor of any self-assembled nanowires in general.

EXAMPLES

The foregoing preparation of nanowires on substrates employing asymmetric lattice mismatch has been illustrated experimentally with four examples: $ScSi_2$, $ErSi_2$, $DySi_2$, and $GdSi_2$ grown on Si(001), which have lattice mismatches of −4.6%, 6.3%, 7.6%, and 8.9%, respectively, along one of the Si<110> directions and mismatches of 0.8%, −1.6%, −0.1%, and 0.8%, respectively, along the perpendicular Sic<110> direction. The resulting self-assembled nanowires have widths and heights in the range of 3 to 11 nm and 0.2 to 3 nm, respectively, depending on the lattice mismatches. The average lengths of the nanowires are in the range 150 to 450 nm, and are determined primarily by kinetic issues. Under suitable kinetic growth conditions, the morphology of the nanowires is predominantly controlled by the lattice-mismatches. A comparison of the $ScSi_2$, $ErSi_2$, $DySi_2$, and $GdSi_2$ systems (arranged in order of increasing lattice mismatch) reveals a decrease in the average nanowire widths and heights and a corresponding increase in average nanowire lengths correlating to the amount of lattice mismatch.

The most work has been done with $ErSi_2$, which is described in Example 1 below. The work with regard to $ScSi_2$, $DySi_2$, $HoSi_2$, and $GdSi_2$ is the subject of Examples 2-5.

Due to the asymmetric lattice mismatch, it is possible to fabricate nanowires having a width and height that are both less than 100 nm (width=1 to 100 nm and height=0.2 to 100 nm) and a length that is within a range of about 10 nm to 110 μm.

Example 1

Growth of $ErSi_2$ on Si.

The following example demonstrates that by utilizing an epitaxial overlayer that has a carefully chosen lattice mismatch to complement the host substrate, in this case erbium disilicide ($ErSi_2$) on Si(001), it is possible to grow nanowires. Due to its high conductivity ($2.9 \times 10^4$ $(\Omega cm)^{-1}$) and low Schottky barrier to n-type Si, $ErSi_2$ thin films grown on Si substrates have been studied extensively. These studies involved continuous thin films on Si(001) that were several nanometers thick, and they revealed oriented crystallites with a hexagonal $AlB_2$-type crystal structure that were thermodynamically stable in contact with Si below 800° C. The [0001] axis of the $ErSi_2$ was oriented along a (110) axis of the Si(001) substrate, and the [11$\bar{2}$0] of the $ErSi_2$ was oriented along the perpendicular (110) axis, with lattice mismatches of +6.5% and −1.3%, respectively, which nearly satisfies the proposed growth conditions for nanowires. Next, submonolayer amounts of Er were deposited on Si(001) and the structure of the resulting crystallites was examined, exploring various growth conditions to optimize one-dimensional growth.

In the present experiments, device quality "flat" Si(001) substrates were prepared by heating to 1200° C. for 20 sec in an ultrahigh vacuum (UHV) chamber with a pressure $<1 \times 10^{-9}$ Torr. Prior to deposition, the surface structures of the substrates were investigated in situ with an Omicron scanning tunneling microscope (STM) with a pressure $<2 \times 10^{-10}$ Torr to ensure they were clean and to examine the nature of the steps on the starting surface. Erbium was then deposited on the substrates with an in situ electron-beam evaporator with the thickness monitored by an internal flux meter that was calibrated by ex situ Rutherford backscattering spectrometry. The substrate temperatures during depositions ranged from room temperature to 620° C. The deposition times ranged from a few seconds to 7 min, yielding coverages of erbium up to ~0.5 monolayer (ML). After a deposition, the samples were annealed at temperatures ranging from 575° to 800° C. for 5 minutes to enhance the chemical reaction between the erbium and silicon and surface migration of the erbium. The surfaces of the samples were then investigated again with the STM. Additionally, one sample was further analyzed in cross-section with a JEOL-4000 transmission electron microscope (TEM).

Figure 4:
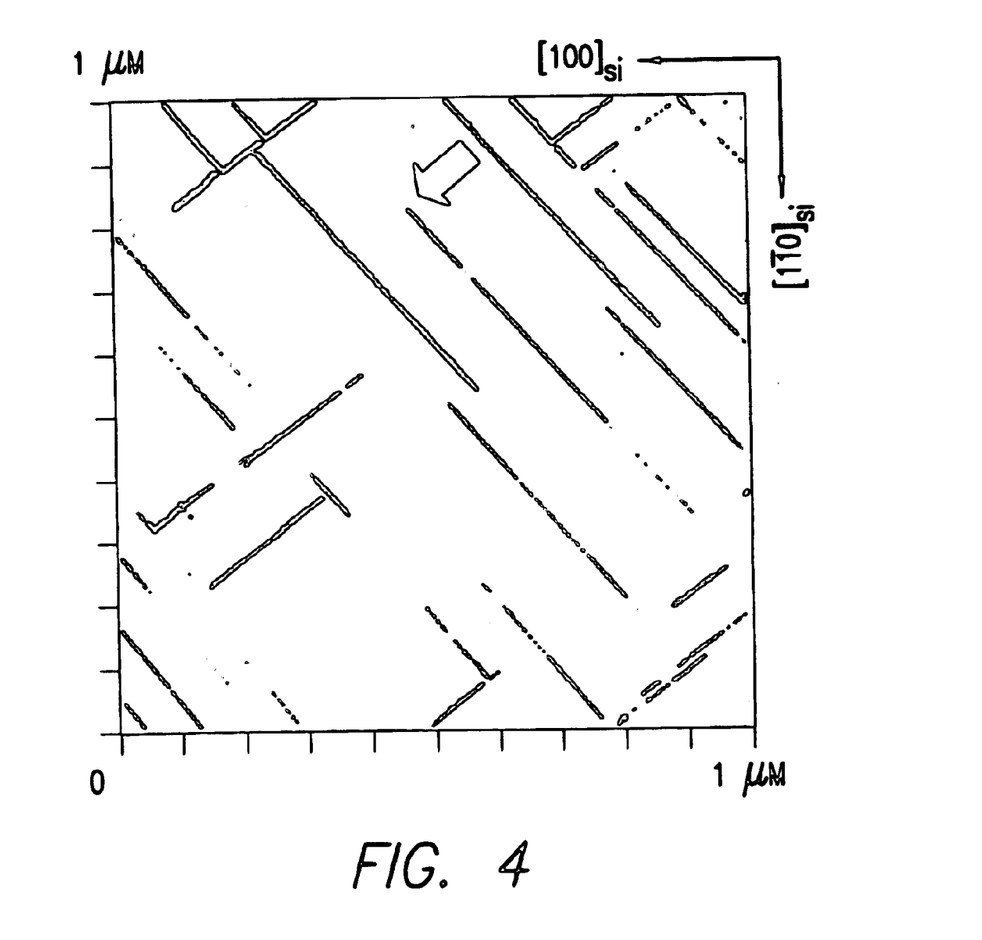
FIG. 4 is a low-resolution STM topograph showing metal silicide, specifically, $ErSi_2$, nanowires grown on a flat Si(001) substrate.

A STM image of $ErSi_2$ nanowires grown on the flat Si(001) substrate is shown in FIG. 4. The substrate slopes upward from bottom right to top left, with terraces of different heights indicated by different stippling. Steps and step bunches, which appear as black irregular lines, are distorted by the nanowires along $[110]_{Si}$ and $[1\bar{1}0]_{Si}$ directions. Before the Er nanowire deposition, the single-atomic-height steps were oriented primarily along the $[\bar{2}10]_{Si}$ axis with average terrace widths of 19.8 nm. The Er was deposited at 620° C. for 1 min, yielding a coverage of ~0.09 ML, and then annealed at 620° C. for 2 more minutes after the deposition. On each Si(001) terrace, the $ErSi_2$ nanowires align along one of the two perpendicular $(110)_{Si}$ directions, not along the original $[\bar{2}10]_{Si}$ step direction. The average dimensions of the two sets of the perpendicular nanowires were measured from STM images with higher magnification, and are listed in Table I. The average length of the nanowires was approximately eight times the original step separation along $[1\bar{1}0]_{Si}$ and $[110]_{Si}$, respectively, The wires were straight and did not follow or terminate at single Si atomic steps, but rather the steps formed a zig-zag pattern that locally followed the nanowires. The cross-sectional TEM images did not reveal any detectable protrusion of the nanowires below the Si(001) surface.

TABLE I

Average dimensions and their interwire standard deviations (listed in parentheses) of the nanowires (NWs) shown in FIG. 4 (units in nm).

|  | Width | Height | Length |
| --- | --- | --- | --- |
| NWs along $[110]_{Si}$ | 5.57 (2.33) | 0.96 (0.35) | 185 (32) |
| NWs along $[1\bar{1}0]_{Si}$ | 3.04 (1.59) | 0.74 (0.32) | 472 (77) |

Figure 5A:
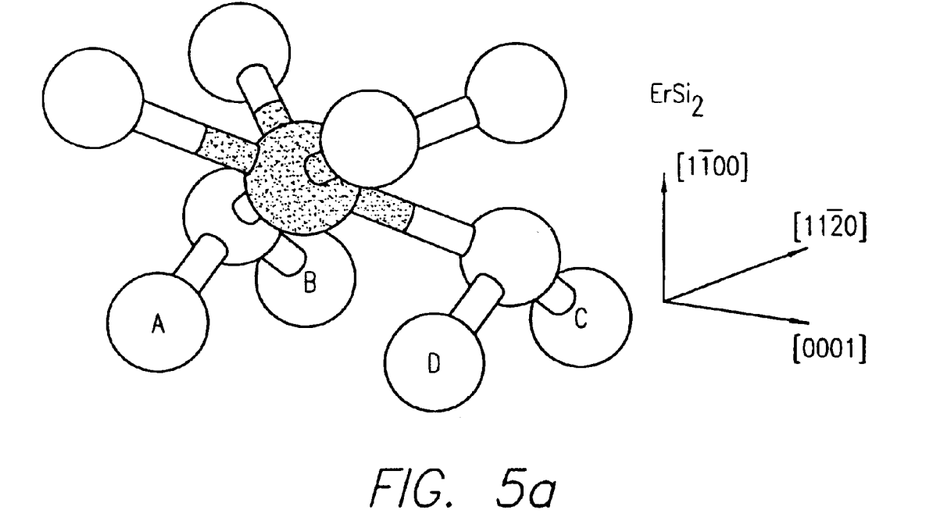
FIGS. 5a–5b are schematic diagrams illustrating the bulk atomic structures of an $ErSi_2$ crystal (FIG. 5a) and a Si crystal (FIG. 5b), and the orientation relationship between the wires and the substrate.
Figure 5B:
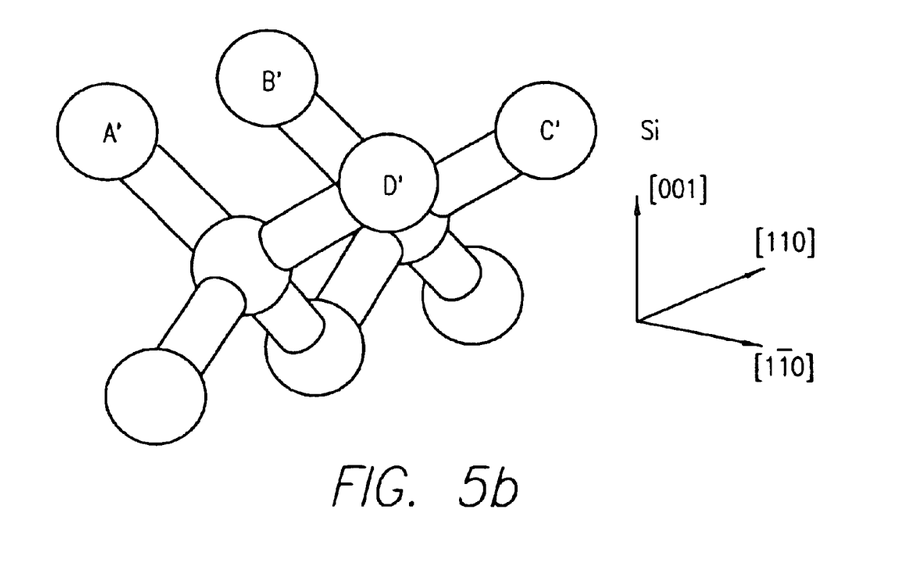

FIGS. 5a–5b illustrate the bulk atomic structures of $ErSi_2$ and Si crystals, respectively, and the orientation relationship between the wires and the substrate. Spheres 50 and 52 represent the Si and Er atoms, respectively. The Si atoms proposed to form the interface between ErSi$_2$ and Si are marked with A, B, C, D, and A', B', C', D', respectively, and the unified ErSi$_2$/Si structure is formed by superimposing A on A', etc. That is to say, when the ErSi$_2$ is bonded to Si(001), the Si atoms in ErSi$_2$ marked as A, B, C, and D could replace those on Si(001) marked as A', B', C', and D', respectively. Such a bonding geometry maintains the bulk-like Si—Si bonds on both the ErSi$_2$ and Si sides of the interface. However, the bulk atomic distances between Si atoms in ErSi$_2$ along the [11$\bar{2}$0]ErSi$_2$ direction (A–B and C–D) and the [0001]ErSi$_2$ direction (A–D and B–C) are 0.379 nm and 0.409 nm, respectively, which differ from the bulk atomic distance, 0.384 nm, between Si atoms (A'–B'–C'–D'–A'). When ErSi$_2$ grows on the Si(001) surface, the lattice-mismatch strain along the

[001] ErSi$_2$ axis increases much faster than that along [11$\bar{2}$0]ErSi$_2$. To minimize the strain energy, the ErSi crystal grows preferentially along the [11$\bar{2}$0]ErSi$_2$ direction.

Given the model shown in FIGS. 5a–5b, the "2×1" dimer rows on the Si(001) surface are oriented along the [1$\bar{1}$0]$_{Si}$ direction by pairing of the dangling bonds on A'–B' and C'–D'. These dimer rows should thus be perpendicular to the nanowires growing on the same terrace.

Without subscribing to any particular theory, since subsurface Si does not react appreciably with the Er to form the nanowires, the source of the Si atoms in the ErSi$_2$ is most likely the step edges. The arrangement of the wires and steps after growth on the flat surface provides an important clue to the mechanism of nanowire formation. As the leading end of a growing nanowire approaches a Si step, the terrace dissolves and effectively retreats from the advancing wire. This creates a "snow-plow" effect, causing successive step edges to bunch up, e.g., as marked by the arrow in FIG. 4. The growth of a nanowire is thus either terminated by intersecting a perpendicular nanowire or by reaching a step bunch that is too high to dissociate. In general, the lengths of the nanowires on different samples were approximately proportional to but significantly longer than the average predeposition terrace widths, and they increased with decreasing nanowire density. The sizes of the nanowires can thus be modulated by the morphology of substrate surface and the amount of deposited Er.

A review of all the metal-silicon phase diagrams and known crystal structures of silicides indicates that ErSi$_2$ is only one example from a significant collection of thermodynamically stable binary compounds that can form nanowires on Si(001). Nearly all of the rare-earth elements have silicides that should form one-dimensional crystals, some with even better lattice matches than ErSi$_2$.

Example 2

Growth of EtSi$_2$, ScSi$_2$, DvSi$_2$, and GdSi$_2$ on Si and Their Comparison.

In the following experiments, device quality "flat" Si(001) substrates were prepared as in Example 1.

As measured from STM images, the average terrace widths along [110]$_{Si}$ and [1$\bar{1}$0]$_{Si}$ were 57.8 nm and 21.3 nm, respectively, implying that the normal direction of the surface of the Si substrate used in these experiments was misoriented from [001]$_{Si}$ toward [120]$_{Si}$ by about 0.4°.

The final state of the nanowires was influenced by their growth conditions, such as deposition and annealing temperature, deposition rate, coverage of deposited atoms, and annealing time. The physical properties of Sc, Er, Dy, and Gd are similar (e.g., their melting points are 1539° C., 1522° C., 1409° C., and 1314° C. respectively), and the experimentally-determined growth conditions for producing dislocation-free nanowires are also very close. The optimum substrate temperature and time for defect-free nanowire growth were about 575 to 620° C. and about 2 to 5 minutes, respectively. When the annealing temperature and/or time exceeded these ranges, dislocations were introduced into the silicide crystals to relieve the lattice-mismatch strain, leading to the coarsening and fragmentation of the nanowires. When the annealing temperature and/or time fell below the optimum ranges, the reaction between the deposited metal and Si substrate was incomplete, and the nanowires remained in their early stages of growth. The amount of deposited metal was usually about 0.05 to 0.5 monolayer (ML). When the coverage fell below this range, only randomly distributed atomic clusters were formed; when the coverage exceeded this range, coarsening and intersection of the nanowires resulted in the formation of silicide meshes or even continuous thin films.

For these ScSi$_2$, ErSi$_2$ DySi$_2$, and GdSi$_2$ samples, the metals were deposited on Si substrates at 600° C. for 2 minutes, yielding coverages of about 0.35 ML Sc, about 0.20 ML Er, about 0.25 ML Dy, and about 0.28 ML Gd. After the deposition, the samples were then annealed at 600° C. for 2 more minutes. Nanowires aligned along one of the two perpendicular <110>$_{Si}$ directions were observed on all four samples. The wires were straight and did not follow or terminate at single Si atomic steps, but rather the steps formed a zig-zag pattern with significant step bunching that locally followed the nanowires.

The widths and heights of the different silicide nanowires varied significantly because of their different lattice-mismatches with respect to the Si substrate. The average dimensions of the ScSi$_2$, ErSi$_2$, DySi$_2$, and GdSi$_2$ nanowires were measured from STM images with higher magnification. The average widths and heights of the nanowires decreased monotonically as the absolute values of the lattice-mismatches along the width direction increases. However, there was no simple relation between the average lengths of the nanowires and the lattice-mismatches along the length direction.

The lattice spacings on all the nanowire surfaces along their length directions agreed with the value of the atomic spacing along <110>$_{Si}$ directions on the Si(001) surface, 0.384 nm, within the measurement uncertainties. The observed periodic structures on the top surfaces of the nanowires agreed well with a "2×n" reconstruction of a slightly distorted silicide surface, where n varies for the different silicides, and thus the silicide lattices appear to be elastically strained to fit the Si substrate in the width direction. No dislocations were observed in the STM images of the nanowires grown under the growth conditions specified above. The top and the edges of the nanowires were usually atomically smooth except for occasional point defects (mainly vacancies). The lattice-mismatch also influenced the shape of the nanowires. The ScSi$_2$ nanowires usually had a trapezoidal cross-section with sidewall slopes in the range 15° to 21°. For the silicides in compression, the nanowires were more rectangular with a (1$\bar{1}$00) plane defining the top surface, but their shape did change with increasing lattice mismatch. The ScSi$_2$, ErSi$_2$, and DySi$_2$ nanowires always grew on the top of a Si terrace, but some sections of GdSi$_2$ nanowires grew into a Si terrace and appeared to be slightly below the level of the surrounding Si as detected by STM. When the end of a growing nanowire approached a Si step, it did not change direction to follow the original Si step edge, but rather the step conformed to the nanowire and/or retreated from the advancing nanowires.

Example 3

Patterning Silicon to Form Silicon Nanowires.

Figure 6A:
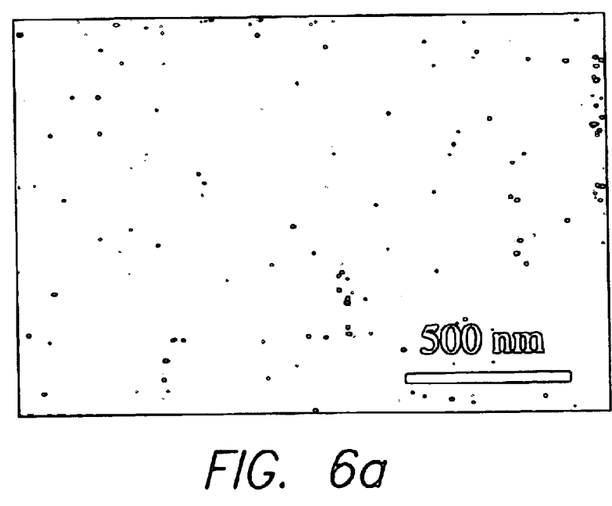
FIGS. 6a–6b are scanning electron microscope images of $ErSi_2$ nanowires grown on Si(001) substrates before reactive ion etching (FIG. 6a) and after reactive ion etching (FIG. 6b) of the silicon substrate.

ErSi$_2$ nanowires, about 1 nm thick, were grown on a Si(001) substrate, as described in Example 1. FIG. 6a is a scanning electron microscope (SEM) image of the ErSi$_2$ self-assembled nanowires grown on the Si substrate. The ErSi$_2$ lines appear to be weaker in FIG. 6a than the Si lines in FIG. 6b, due to the fact that the ErSi$_2$ wires are less than 1 mm and their interaction with the e-beam in the SEM are very weak.

Figure 6B:
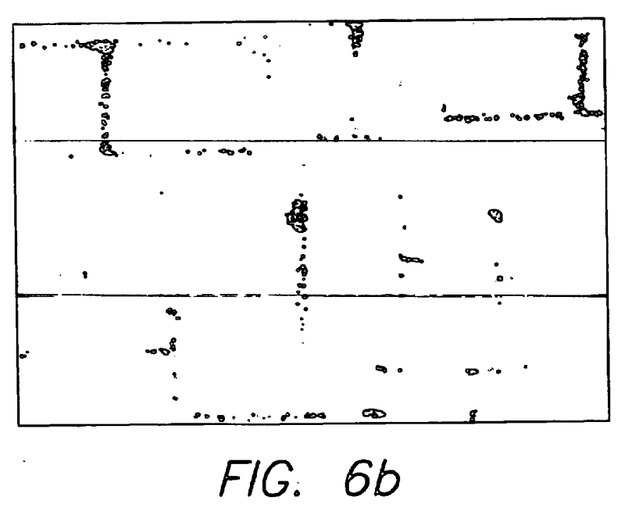

Using the ErSi$_2$ nanowires as a mask, the silicon was anisotropically etched away in the area without the coverage of the ErSi$_2$ nanowires. The etching was carried out by RIE for 5 minutes in CF$_4$, SF$_6$, and Ar gases with their flowing rates as CF$_4$:SF$_6$:Ar=25 sccm:125 sccm:60 sccm, at a pressure of 50 mTorr and a power of 100 W. ErSi$_2$ was subsequently removed from the tops of the Si nanowires, using HF. The resulting silicon nanowires were about 9 nm in height. FIG. 6b is an SEM image of the silicon nanowires after RIE and after removal of the ErSi$_2$.

Example 4

Patterning Ge$_x$Si$_{1-x}$ to Form Ge$_x$Si$_{1-x}$ Nanowires.

Er(Ge$_x$Si$_{1-x}$)$_2$ nanowires, about 1 nm thick, are grown on a Ge$_x$Si$_{1-x}$ substrate, where 0<x<1, using procedures similar to those described in Example 1. Using the Er(Ge$_x$Si$_{1-x}$)$_2$ nanowires as a mask, the Ge$_x$Si$_{1-x}$ is anisotropically etched away in the area without the coverage of the Er(Ge$_x$Si$_{1-x}$) nanowires. The etching is carried out by RIE for 5 minutes in CF$_4$, SF$_6$, and Ar gases with their flowing rates as CF$_4$:SF$_6$:Ar=25 sccm:125 sccm:60 sccm, at a pressure of 50 mTorr and a power of 100 W. Er(Ge$_x$Si$_{1-x}$)$_2$ is subsequently removed from the tops of the Ge$_x$Si$_{1-x}$ nanowires, using a suitable etchant. The resulting Ge$_x$Si$_{1-x}$ nanowires are about 10 nm in height.

INDUSTRIAL APPLICABILITY

The formation of crystalline nanoscale wires is expected to find use in devices and structures that employ nanowires.

What is claimed is:

1. A process for using a mask having a first composition to aid in forming nanowires having a second composition, comprising:
    (a) providing an etchable layer having said second composition and having a buried insulating layer beneath a major surface thereof;
    (b) epitaxially growing self-assembled nanowires having said first composition on said major surface of said etchable layer, whereby an interfacial plane is formed between said self-assembled nanowires and said etchable layer, wherein said material comprising said self-assembled nanowires is closely-lattice matched to said material comprising said etchable along one major crystallographic axis on said interfacial plane, but has significant lattice mismatch along all other major crystallographic axes on said interfacial plane, said epitaxial growing performed by
        selecting as said material a composition that is closely-lattice matched to said etchable material along one major crystallographic axis, but has significant lattice mismatch along all other crystallographic axes in said interfacial plane,
        cleaning a surface of said substrate so that said surface has an atomically flat, regular atomic structure on terraces and has regular steps and so that impurities are removed, and
        epitaxially growing said self-assembled nanowires on said etchable layer; and
    (c) anisotropically etching portions of said etchable layer down to said insulating layer, using said self-assembled nanowires as a mask, to form said nanowires of said second composition.

2. The process of claim 1 wherein after step (b), a separate molecular or atomic species is deposited on said self-assembled nanowires that preferentially bonds to said self-assembled nanowires so as to enhance a differential etch rate between said nanowires and said etchable layer.

3. The process of claim 1 wherein said second composition is either a semiconductor material selected from the group consisting of Si, Ge, Ge$_x$Si$_{1-x}$ where 0<x<1, GaAs, InAs, AlGaAs, InGaAs, AlGaAs, GaN, InN, AlN, AlGaN, and InGaN or a metal selected from the group consisting of Al, Cu, Ti, Cr, Fe, Co, Ni, Zn, Ga, Nb, Mo, Pd, Ag, In, Ta, W, Re, Os, Ir, Pt, and Au, and alloys thereof.

4. The process of claim 3 wherein said second composition comprises silicon.

5. The process of claim 1 wherein said buried insulating layer comprises an oxide or a nitride or a mixture thereof or a metal fluoride.

6. The process of claim 5 wherein said oxide comprises silicon dioxide or wherein said nitride comprises silicon nitride or wherein said mixture comprises silicon oxynitride or wherein said metal fluoride comprises calcium fluoride.

7. The process of claim 1 wherein said etchable layer has a thickness within a range of about 1 to 100 nm.

8. The process of claim 1 wherein said self-assembled nanowires have a width within a range of about 1 to 100 nm, a height within a range of about 0.2 to 100 nm, and a length within a range of about 10 nm to 10 μm.

9. The process of claim 1 wherein said self-assembled nanowires comprise a metal silicide and wherein said etchable layer comprises silicon, in which said metal is deposited on said silicon layer and said metal is converted to said metal silicide.

10. The process of claim 9 wherein said metal silicide is represented by the formula MSi$_2$, where M is selected from the group consisting of scandium, yttrium, and rare earths.

11. The process of claim 10 wherein said rare earths are selected from the group consisting of erbium, dysprosium, gadolinium, thulium, holmium, terbium, and samarium.

12. The process of claim 1 wherein said forming in step (c) is performed with an in situ electron-beam evaporator, employing layer temperatures ranging from room temperature to 800° C.

13. The process of claim 12 wherein after said forming in step (c), said nanowires formed on said silicon layer are annealed to complete any chemical reaction between said nanowires and said etchable layer.

14. The process of claim 13 wherein said annealing is performed at a temperature within a range of 575° to 800° C. for a time of up to 5 minutes.

15. The process of claim 1 wherein reactive ion etching is used to anisotropically etch said etchable layer relative to said self-assembled nanowires.

16. The process of claim 15 wherein said etchable layer has an etching rate in said anisotropic etching that is at least twice that of said self-assembled nanowires.

17. The process of claim 1 wherein after step (c), said self-assembled nanowires are removed from said formed nanowires.

18. The process of claim 17 wherein said self-assembled nanowires are removed from said formed nanowires by selective chemical etching.

19. The process of claim 18 wherein said self-assembled nanowires have an etching rate during said selective chemical etching that is at least twice that of said etchable layer.

20. A process for using a mask having a first composition to aid in forming nanowires having a second composition, comprising:

providing an etchable layer having said second composition and having a buried insulating layer beneath a major surface thereof;

growing self-assembled nanowires having said first composition on said major surface; and anisotropically etching portions of said etchable layer down to said insulating layer, using said self-assembled nanowires as a mask, to form said nanowires of said second composition, wherein reactive ion etching is used to anisotropically etch said etchable layer relative to said self-assembled nanowires and wherein said etchable layer has an etching rate in said anisotropic etching that is at least twice that of said self-assembled nanowires.

21. The process of claim 20 wherein after the second step, a separate molecular or atomic species is deposited on said self-assembled nanowires that preferentially bonds to said self-assembled nanowires so as to enhance a differential etch rate between said nanowires and said etchable layer.

22. The process of claim 20 wherein said second composition is either a semiconductor material selected from the group consisting of Si, Ge, $Ge_xSi_{1-x}$ where 0<x<1, GaAs, InAs, AlGaAs, InGaAs, AlGaAs, GaN, InN, AlN, AlGaN, and InGaN or a metal selected from the group consisting of Al, Cu, Ti, Cr, Fe, Co, Ni, Zn, Ga, Nb, Mo, Pd, Ag, In, Ta, W, Re, Os, Ir, Pt, and Au, and alloys thereof.

23. The process of claim 22 wherein said second composition comprises silicon.

24. The process of claim 20 wherein said buried insulating layer comprises an oxide or a nitride or a mixture thereof or a metal fluoride.

25. The process of claim 24 wherein said oxide comprises silicon dioxide or wherein said nitride comprises silicon nitride or wherein said mixture comprises silicon oxynitride or wherein said metal fluoride comprises calcium fluoride.

26. The process of claim 20 wherein said etchable layer has a thickness within a range of about 1 to 100 nm.

27. The process of claim 20 wherein said self-assembled nanowires are epitaxially grown on said etchable layer, whereby an interfacial plane is formed between said self-assembled nanowires and said etchable layer, wherein said material comprising said self-assembled nanowires is closely-lattice matched to said material comprising said etchable along one major crystallographic axis on said interfacial plane, but has significant lattice mismatch along all other major crystallographic axes on said interfacial plane, said method comprising:

selecting as said material a composition that is closely-lattice matched to said etchable material along one major crystallographic axis, but has significant lattice mismatch along all other crystallographic axes in said interfacial plane;

cleaning a surface of said substrate so that said surface has an atomically flat, regular atomic structure on terraces and has regular steps and so that impurities are removed; and epitaxially growing said self-assembled nanowires on said etchable layer.

28. The process of claim 27 wherein said self-assembled nanowires have a width within a range of about 1 to 100 nm, a height within a range of about 0.2 to 100 nm, and a length within a range of about 10 nm to 10 $\mu$m.

29. The process of claim 27 wherein said self-assembled nanowires comprise a metal silicide and wherein said etchable layer comprises silicon, in which said metal is deposited on said silicon layer and said metal is converted to said metal silicide.

30. The process of claim 29 wherein said metal silicide is represented by the formula $MSi_2$, where M is selected from the group consisting of scandium, yttrium, and rare earths.

31. The process of claim 30 wherein said rare earths are selected from the group consisting of erbium, dysprosium, gadolinium, thulium, holmium, terbium, and samarium.

32. The process of claim 27 wherein said forming in said third step is performed with an in situ electron-beam evaporator, employing layer temperatures ranging from room temperature to 800° C.

33. The process of claim 32 wherein after said forming in said third step; said nanowires formed on said silicon layer are annealed to complete any chemical reaction between said nanowires and said etchable layer.

34. The process of claim 33 wherein said annealing is performed at a temperature within a range of 575° to 800° C. for a time of up to 5 minutes.

35. The process of claim 20 wherein after said third step, said self-assembled nanowires are removed from said formed nanowires.

36. The process of claim 35 wherein said self-assembled nanowires are removed from said formed nanowires by selective chemical etching.

37. The process of claim 36 wherein said self-assembled nanowires have an etching rate during said selective chemical etching that is at least twice that of said etchable layer.

38. A process for using a mask having a first composition to aid in forming nanowires having a second composition, comprising:

providing an etchable layer having said second composition and having a buried insulating layer beneath a major surface thereof;

growing self-assembled nanowires having said first composition on said major surface;

anisotropically etching portions of said etchable layer down to said insulating layer, using said self-assembled nanowires as a mask, to form said nanowires of said second composition; and removing said self-assembled nanowires from said formed nanowires by selective chemical etching, wherein said self-assembled nanowires have an etching rate during said selective chemical etching that is at least twice that of said etchable layer.

39. The process of claim 38 wherein after said second step, a separate molecular or atomic species is deposited on said self-assembled nanowires that preferentially bonds to said self-assembled nanowires so as to enhance a differential etch rate between said nanowires and said etchable layer.

40. The process of claim 38 wherein said second composition is either a semiconductor material selected from the group consisting of Si, Ge, $Ge_xSi_{1-x}$ where 0<x<1, GaAs, InAs, AlGaAs, InGaAs, AlGaAs, GaN, InN, AlN, AlGaN, and InGaN or a metal selected from the group consisting of Al, Cu, Ti, Cr, Fe, Co, Ni, Zn, Ga, Nb, Mo, Pd, Ag, In, Ta, W, Re, Os, Ir, Pt, and Au, and alloys thereof.

41. The process of claim 40, wherein said second composition comprises silicon.

42. The process of claim 38 wherein said buried insulating layer comprises an oxide or a nitride or a mixture thereof or a metal fluoride.

43. The process of claim 42 wherein said oxide comprises silicon dioxide or wherein said nitride comprises silicon nitride or wherein said mixture comprises silicon oxynitride or wherein said metal fluoride comprises calcium fluoride.

44. The process of claim 38 wherein said etchable layer has a thickness within a range of about 1 to 100 nm.

45. The process of claim 38 wherein said self-assembled nanowires are epitaxially grown on said etchable layer, whereby an interfacial plane is formed between said self-assembled nanowires and said etchable layer, wherein said material comprising said self-assembled nanowires is closely-lattice matched to said material comprising said etchable along one major crystallographic axis on said interfacial plane, but has significant lattice mismatch along all other major crystallographic axes on said interfacial plane, said method comprising:
- selecting as said material a composition that is closely-lattice matched to said etchable material along one major crystallographic axis, but has significant lattice mismatch along all other crystallographic axes in said interfacial plane;
- cleaning a surface of said substrate so that said surface has an atomically flat, regular atomic structure on terraces and has regular steps and so that impurities are removed; and
- epitaxially growing said self-assembled nanowires on said etchable layer.

46. The process of claim 45 wherein said self-assembled nanowires have a width within a range of about 1 to 100 nm, a height within a range of about 0.2 to 100 nm, and a length within a range of about 10 nm to 10 $\mu$m.

47. The process of claim 45 wherein said self-assembled nanowires comprise a metal silicide and wherein said etchable layer comprises silicon, in which said metal is deposited on said silicon layer and said metal is converted to said metal silicide.

48. The process of claim 47 wherein said metal silicide is represented by the formula $MSi_2$, where M is selected from the group consisting of scandium, yttrium, and rare earths.

49. The process of claim 48 wherein said rare earths are selected from the group consisting of erbium, dysprosium, gadolinium, thulium, holmium, terbium, and samarium.

50. The process of claim 45 wherein said forming in said third step is performed with an in situ electron-beam evaporator, employing layer temperatures ranging from room temperature to 800° C.

51. The process of claim 50 wherein after said forming in said third step, said nanowires formed on said silicon layer are annealed to complete any chemical reaction between said nanowires and said etchable layer.

52. The process of claim 51 wherein said annealing is performed at a temperature within a range of 575° to 800° C. for a time of up to 5 minutes.

53. The process of claim 38 wherein reactive ion etching is used to anisotropically etch said etchable layer relative to said self-assembled nanowires.

54. The process of claim 53 wherein said etchable layer has an etching rate in said anisotropic etching that is at least twice that of said self-assembled nanowires.

* * * * *